(12) United States Patent
Jeong et al.

(10) Patent No.: US 8,216,860 B2
(45) Date of Patent: Jul. 10, 2012

(54) METHOD OF FABRICATING SEMICONDUCTOR DEVICE

(75) Inventors: Joo-hyun Jeong, Yongin-si (KR); Chul-ho Chung, Hwaseong-si (KR)

(73) Assignee: Samsung Electronics Co., Ltd., Suwon-si, Gyeonggi-do (JP)

( * ) Notice: Subject to any disclaimer, the term of this patent is extended or adjusted under 35 U.S.C. 154(b) by 0 days.

(21) Appl. No.: 13/083,309

(22) Filed: Apr. 8, 2011

(65) Prior Publication Data

US 2011/0183441 A1 Jul. 28, 2011

Related U.S. Application Data

(62) Division of application No. 11/656,451, filed on Jan. 23, 2007, now Pat. No. 7,923,814.

(30) Foreign Application Priority Data

Jan. 24, 2006 (KR) .................. 10-2006-0007380

(51) Int. Cl.
  *H01L 21/02* (2006.01)
(52) U.S. Cl. .................. 438/3; 257/E21.002
(58) Field of Classification Search .................. 438/3; 257/E21.002
See application file for complete search history.

(56) References Cited

U.S. PATENT DOCUMENTS

| | | | |
|---|---|---|---|
| 5,117,321 A | 5/1992 | Nakanishi et al. |
| 5,884,990 A | 3/1999 | Burghartz et al. |
| 5,896,078 A | 4/1999 | Hayakawa et al. |
| 6,121,852 A | 9/2000 | Mizoguchi et al. |
| 6,351,204 B1 | 2/2002 | Yamasawa et al. |
| 6,414,564 B1 | 7/2002 | Mizoguchi et al. |
| 6,573,818 B1 | 6/2003 | Klemmer et al. |
| 2003/0156449 A1 | 8/2003 | Ooishi |
| 2003/0214015 A1 | 11/2003 | Akiyama |
| 2004/0157370 A1 | 8/2004 | Gardner |
| 2004/0250411 A1 | 12/2004 | Gardner |
| 2005/0093668 A1 | 5/2005 | Bueyuektas et al. |

(Continued)

FOREIGN PATENT DOCUMENTS

JP 02-275605 A 11/1990
(Continued)

OTHER PUBLICATIONS

Yamaguchi, M., et al., "Characteristics and analysis of a thin film inductor with closed magnetic circuit structure", IEEE Transactions on Magnetics; vol. 28, No. 5, pp. 3015-3017, (Sep. 1992).

(Continued)

*Primary Examiner* — David S Blum
(74) *Attorney, Agent, or Firm* — Lee & Morse, P.C.

(57) ABSTRACT

A semiconductor device and a method of fabricating a semiconductor device that includes forming an interlayer insulating film on a semiconductor substrate; depositing a first soft magnetic thin film on the interlayer insulating film through sputtering using a target containing at least one of Fe, Co, Ni, or alloys thereof, the target further containing at least one of Ti, Hf, or B, the sputtering being performed using an $N_2$ reactive gas; forming a metal film on the first soft magnetic thin film; depositing a second soft magnetic thin film on the metal film through sputtering using the same or another target containing at least one of Fe, Co, Ni, or alloys thereof, the target further containing at least one of Ti, Hf, or B, the sputtering being performed using an $N_2$ reactive gas; and patterning to form an inductor.

10 Claims, 5 Drawing Sheets

U.S. PATENT DOCUMENTS

2006/0273418 A1    12/2006    Chung et al.

FOREIGN PATENT DOCUMENTS

| | | |
|---|---|---|
| JP | 07-153912 A | 6/1995 |
| JP | 07-161935 A | 6/1995 |
| JP | 2003-338547 A | 11/2003 |

OTHER PUBLICATIONS

Oshiro, O., et al., "High Frequency Characteristics of a Planar Inductor and a Magnetic Coupling Control Device,", IEEE Translation Journal on Magnetics in Japan; vol. 6, No. 5, pp. 436-442 (May 1991).

METHOD OF FABRICATING SEMICONDUCTOR DEVICE

CROSS REFERENCE TO RELATED APPLICATION

This is a divisional application based on application Ser. No. 11/656,451, now U.S. Pat. No. 7,923,814, filed Jan. 23, 2007, the entire contents of which is hereby incorporated by reference.

BACKGROUND OF THE INVENTION

1. Field of the Invention

The invention relates to a method of fabricating a semiconductor device and, more particularly, to a method of fabricating an inductor that has high inductance, has high quality factor (Q) and may be designed under the same design environments as logic devices.

2. Description of the Related Art

In general, an SOC (System-on-a-Chip), which is referred to as an LSI (Large Scale Integrated circuit) system or an IC (Integrated Circuit) system, is obtained on one chip by integrating a system that has been constructed on a PCB (Printed Circuit Board) using a single semiconductor. That is, an SOC is a chip having complete and operable products thereon. For example, an SOC used in communication includes a microprocessor, DSP (Digital Signal Processor), RAM (Random Access Memory) or ROM (Read Only Memory). When using such an SOC, the size of the system further decreases and the assembling process becomes simplified.

In an SOC, a conventional semiconductor device and an RF (Radio Frequency) circuit device can be obtained on one chip. The mixed signal circuit used in the RF range follows the trend of being formed on a silicon-based semiconductor substrate. Such a circuit includes basic passive devices, such as resistors, capacitors, and inductors.

In particular, an inductor, which has the largest area among the passive devices, should have high performance, that is, high inductance (L) and quality factor (Q) determining its ability to accumulate energy. As the quality factor (Q) increases, the frequency properties of a voltage-controlled oscillator and a band pass filter are stabilized and the loss from these components decreases.

In an inductor, inductance is determined by the length of the metal wire of the inductor, and also the quality factor (Q) depends upon the resistance of the metal wire. However, in the uppermost metal wire, used as the inductor in an RF CMOS (Complementary Metal Oxide Semiconductor) process or a general logic process, it is difficult to sufficiently extend the length of the metal wire due to the limited area of the chip. Further, the thickness of the metal wire is insufficient due to the limitations of the process. Therefore, the resistance of the inductor increases to result in a low quality factor (Q).

SUMMARY OF THE INVENTION

The invention is therefore directed to a semiconductor device including an inductor having a high quality factor (Q) that substantially overcomes one or more of the problems due to the limitations and disadvantages of the related art.

It is therefore a feature of the invention to provide a semiconductor device including an inductor having a high quality factor (Q).

At least one of the above and other features and advantages of the present invention may be realized by providing a method of fabricating a semiconductor device that includes forming an interlayer insulating film on a semiconductor substrate; depositing a first soft magnetic thin film on the interlayer insulating film through sputtering using a target formed from at least one of Fe, Co, Ni, or alloys thereof, the target further including at least one of Ti, Hf, or B, the sputtering being performed using $N_2$ reactive gas; forming a metal film on the first soft magnetic thin film; depositing a second soft magnetic thin film on the metal film through sputtering using a same or another target including Fe, Co, Ni, or alloys thereof, and at least one selected from Ti, Hf, or B, the sputtering being performed using $N_2$ reactive gas; and patterning the first soft magnetic thin film, the metal film, and the second soft magnetic thin film, which are laminated, using the same mask, to form an inductor.

At least one of the above and other features and advantages of the present invention may be realized by providing a method of fabricating a semiconductor device that includes forming an interlayer insulating film having multiple lower wire layers on a semiconductor substrate; depositing a first soft magnetic thin film on the interlayer insulating film through sputtering using a target including at least one of Fe, Co, Ni, or alloys thereof, and at least one element selected from at least one of Ti, Hf, or B, the sputtering being performed using $N_2$ reactive gas; forming an uppermost metal wire layer on the first soft magnetic thin film; depositing a second soft magnetic thin film on the uppermost metal wire layer through sputtering using a same or another target including at least one of Fe, Co, Ni, or alloys thereof, and at least one element selected from Ti, Hf, or B, the sputtering being performed using $N_2$ reactive gas; and patterning the first soft magnetic thin film, the uppermost metal wire layer, and the second soft magnetic thin film, which are laminated, using the same mask, to form an inductor and the uppermost wire layer coupled with at least one of the lower wire layers.

At least one of the above and other features and advantages of the present invention may be realized by providing a semiconductor device including an interlayer insulating film formed on a semiconductor substrate; and an inductor provided on the interlayer insulating film, the inductor including a first soft magnetic thin film pattern formed on the interlayer insulating film and has a) at least one of Fe, Co, Ni, or alloys thereof; b) at least one element selected from Ti, Hf, and B; and c) N, a metal film pattern formed on the first soft magnetic thin film pattern, and a second soft magnetic thin film pattern which is formed on the metal film pattern and has a) at least one selected from Fe, Co, Ni, or alloys thereof; b) at least one element selected from Ti, Hf, or B; and c) N.

At least one of the above and other features and advantages of the present invention may be realized by providing a semiconductor device including an interlayer insulating film, which is formed on a semiconductor substrate and has multiple lower wire layers; and an inductor and an uppermost wire layer coupled with a lower wire layer, which are provided on the interlayer insulating film, the inductor and the uppermost wire layer each including a first soft magnetic thin film pattern which is formed on the interlayer insulating film and has a) at least one selected from Fe, Co, Ni, or alloys thereof; b) at least one element selected from Ti, Hf, or B, and c) N; a metal film pattern formed on the first soft magnetic thin film pattern; and a second soft magnetic thin film pattern which is formed on the metal film pattern and has a) at least one selected from Fe, Co, Ni, or alloys thereof; b) at least one element selected from Ti, Hf, or B; and c) N.

BRIEF DESCRIPTION OF THE DRAWINGS

The above and other features and advantages of the invention will become more apparent to those of ordinary skill in the art by describing in detail exemplary embodiments thereof with reference to the attached drawings in which.

DETAILED DESCRIPTION OF THE INVENTION

Figure 1:
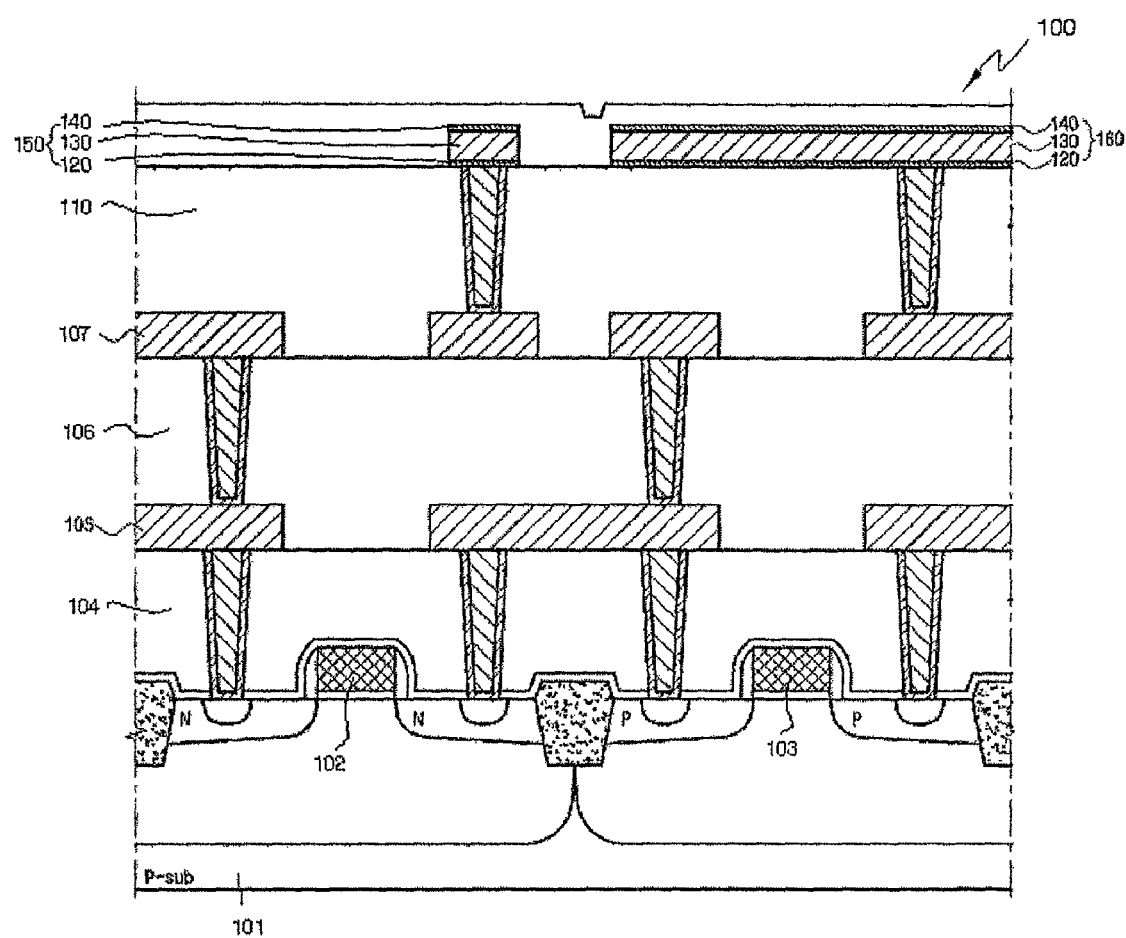
FIG. 1 illustrates a cross-sectional view of a preferred embodiment of a semiconductor device of the invention.

Korean Patent Application No. 10-2006-0007380 filed on Jan. 24, 2006, in the Korean Intellectual Property Office, and entitled: "Method of Fabricating Semiconductor Device," is incorporated by reference herein in its entirety.

The invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a preferred embodiment of a semiconductor device according to the invention.

Although the semiconductor device 100 is illustrated in FIG. 1 as having three metal wire layers for convenience of description, the invention is not limited thereto, and four or more wire layers may be included.

FIG. 1 illustrates the inventive semiconductor device 100 that includes an interlayer insulating film 104 formed on a semiconductor substrate 101. The semiconductor substrate 101 may be formed from silicon (Si), gallium arsenide (GaAs), silicon-on-glass (SOG) or any other suitable material.

Multiple transistors having gates 102, 103 may be formed on the semiconductor substrate 101. Further, multiple interlayer insulating films 104, 106 are positioned on the transistors. In addition, a first metal wire layer 105 and a second metal wire layer 107 may be formed along with multiple contact holes and multiple vias on the respective interlayer insulating films 104, 106 to electrically connect the transistors.

Further, another interlayer insulating film 110 may be formed on the interlayer insulating layer 106. The interlayer insulating film 110 may be formed using silicon oxide ($SiO_x$), silicon oxynitride (SiON), titanium oxide ($TiO_x$), tantalum oxide ($TaO_x$) or any other suitable insulating material.

An inductor 150 and an uppermost wire layer 160 may be formed on the uppermost interlayer insulating film 110. The inductor 150 and the uppermost wire layer 160 both include a first soft magnetic thin film pattern 120, a metal film pattern 130, and a second soft magnetic thin film pattern 140.

The first soft magnetic thin film pattern 120 having high magnetic permeability increases the thickness of the conductive film so as to decrease a resistance of the subsequent metal film pattern 130. This aspect of the invention is further discussed in the description of a preferred method of fabricating the semiconductor device set forth below.

The first soft magnetic thin film pattern 120 is formed from at least one material selected from iron (Fe), cobalt (Co), nickel (Ni), or alloys thereof; at least one element selected from titanium (Ti), hafnium (Hf), or boron (B); and nitrogen (N). That is, the soft magnetic thin film having high magnetic permeability is formed using any one of or a combination of Fe, Co, Ni, or alloys thereof as a ferromagnetic material; any one or a combination of Ti, Hf, or B as a transition metal; and N. For example, the first soft magnetic thin film pattern 120 may be formed of FeTiN, FeBN, FeN, FeHfN, FeCoN, etc. In addition, the first soft magnetic thin film pattern 120 may be formed to a thickness of about 5,000-10,000 Å.

Further, the metal film pattern 130 is positioned on the first soft magnetic thin film pattern 120.

As such, the metal film pattern 130 may be formed of aluminum, copper or other suitable material. The metal film pattern 130 may be formed to have a thickness of about 2-3 μm using a process following the 180 nm design rule. However, the invention is not limited thereto, and the thickness may be controlled depending on the design rule of the process used. The metal film on the uppermost interlayer insulating film 110 is used as the metal film pattern 130 included in the inductor 150 because it is further spaced apart from the semiconductor substrate 101 and decreases parasitic effects with the semiconductor substrate 101.

In addition, the second soft magnetic thin film pattern 140 is formed on the metal film pattern 130.

The second soft magnetic thin film pattern 140 has high magnetic permeability and is formed to increase the thickness of the conductive film so as to decrease the resistance of the lower metal film pattern 130.

Similar to the first soft magnetic thin film pattern 120, the second soft magnetic thin film pattern 140 includes any one of Fe, Co, Ni, or alloys thereof; any one element selected from Ti, Hf, or B; and N. For example, the second soft magnetic thin film pattern 140 may be formed of FeTiN, FeBN, FeN, FeHfN, FeCoN, etc. In addition, the second soft magnetic thin film pattern 140 may be formed to a thickness of about 5,000-10,000 Å. Although the first soft magnetic thin film pattern 120 and the second soft magnetic thin film pattern 140 may be formed to have the same composition, they may alternatively be composed of different compositions.

FIGS. 2 to 5 illustrate sequential cross-sections depicting a process of fabricating the semiconductor device 100, according to a preferred embodiment of the invention.

Figure 2:
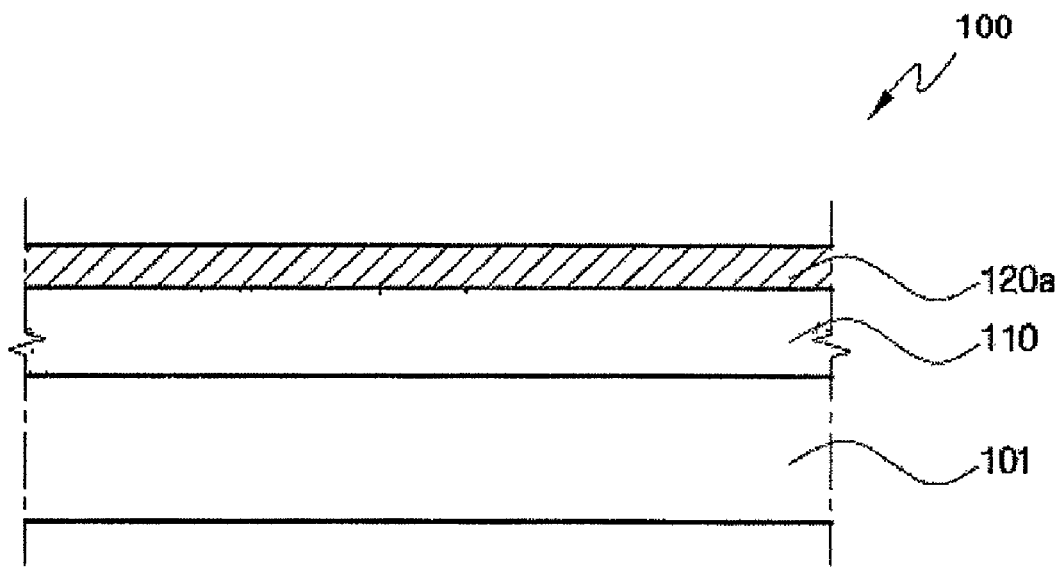
FIGS. 2 to 5 illustrate sequential cross-sectional views for a process of fabricating a semiconductor device, according to a preferred embodiment of the invention.

FIG. 2 illustrates an interlayer insulating film 110 having multiple lower wire layers 105, 107 (illustrated in FIG. 1) formed on a semiconductor substrate 101. The interlayer insulating film 110 represents an interlayer insulating film formed on an uppermost portion of the semiconductor device 100.

The interlayer insulating film 110 may be formed of silicon oxide ($SiO_x$), silicon oxynitride (SiON), titanium oxide ($TiO_x$), tantalum oxide ($TaO_x$) or any other suitable insulating material. The interlayer insulating film 110 may be formed through chemical vapor deposition (CVD).

A first soft magnetic thin film 120a may be formed on the interlayer insulating film 110. The first soft magnetic thin film 120a may be deposited through sputtering using a target including any one of Fe, Co, Ni, or alloys thereof; any one element selected from Ti, Hf, or B; in an $N_2$ reactive gas environment. Specifically, the target may be a composite target comprising any one of Fe, Co, Ni, or alloys thereof, and any one element selected from Ti, Hf, or B, mixed at an appropriate ratio. In order to function as the composite target, a predetermined target, which is in the form of a chip including any one of Ti, Hf, or B, is attached to a single target composed of any one element selected from Fe, Co, or Ni. Then, sputtering is performed. That is, any one selected from Fe, Co, Ni, or alloys thereof, as a ferromagnetic material, is mixed with any one element selected from Ti, Hf, or B, as a transition metal, at an appropriate ratio and subjected to sputtering using $N_2$ reactive gas. The result is a soft magnetic material having high magnetic permeability. The first soft magnetic thin film 120a resulting from such a sputtering process may be formed of FeTiN, FeBN, FeN, FeHfN, FeCoN, etc.

In addition, the first soft magnetic thin film 120a may be formed to have a thickness of about 5,000-10,000 Å to exhibit the appropriate magnetic permeability.

In this way, the first soft magnetic thin film 120a may be formed to increase inductance thanks to its high magnetic permeability. Further, the first soft magnetic thin film 120a may be a conductive film in addition to the subsequently deposited metal film 130a, and thus the total thickness of the conductive film increases. The relationship between the thickness and resistance of the conductive film is represented by Equation 1 below:

$$R = \frac{L}{A} * \rho \qquad \text{(Equation 1)}$$

where L is length, A is sectional area, and ρ is specific resistance.

The sectional area is obtained by multiplying thickness and width. Thus, when the thickness is increased, the sectional area (A) is increased and therefore resistance (R) is decreased.

The quality factor (Q) of an inductor is the ratio of its inductive reactance to its resistance at a given frequency, and is a measure of its efficiency. The higher the quality factor (Q) of the inductor, the closer it approaches the behavior of an ideal, lossless, inductor. The quality factor (Q) of the inductor is represented by Equation 2 below:

$$Q = \frac{\omega * L}{R} \qquad \text{(Equation 2)}$$

where L is inductance, R is resistance, and ω is resonance frequency.

The resonance frequency ω is a frequency at maximum current or voltage due to resonance generated when the natural frequency of the inductor is equal to the frequency of the power source.

Hence, when the first soft magnetic thin film 120a having high magnetic permeability is deposited, the inductance (L) increases, and the thickness of the conductive film having the metal film 130a is increased. Resistance (R) is thereby reduced to lead to an increased quality factor (Q).

Figure 3:
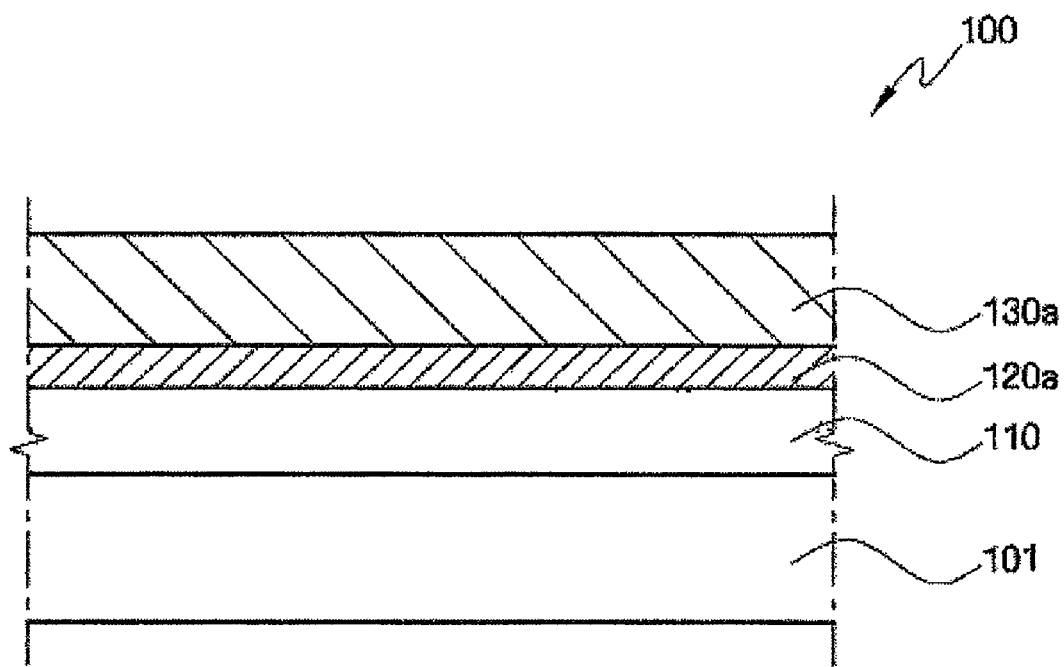

Thereafter, as illustrated in FIG. 3, the uppermost metal film 130a is formed on the first soft magnetic thin film 120a. The metal film 130a is formed of aluminum, copper or other suitable material. If the metal film 130a is formed of aluminum, it may be deposited through physical vapor deposition. As such, if the aluminum film process follows the 180 nm design rule, then the metal film 130a may be formed to a thickness of about 2-3 μm. On the other hand, if the metal film 130a is formed of copper, it may be formed through an electroplating process. As such, the copper film process follows a 130 nm or less design rule, and the metal film 130a may be formed to a thickness of about 3 μm. However, the invention is not limited thereto, and the thickness may be varied and controlled depending on the design rule of the process used.

Figure 4:
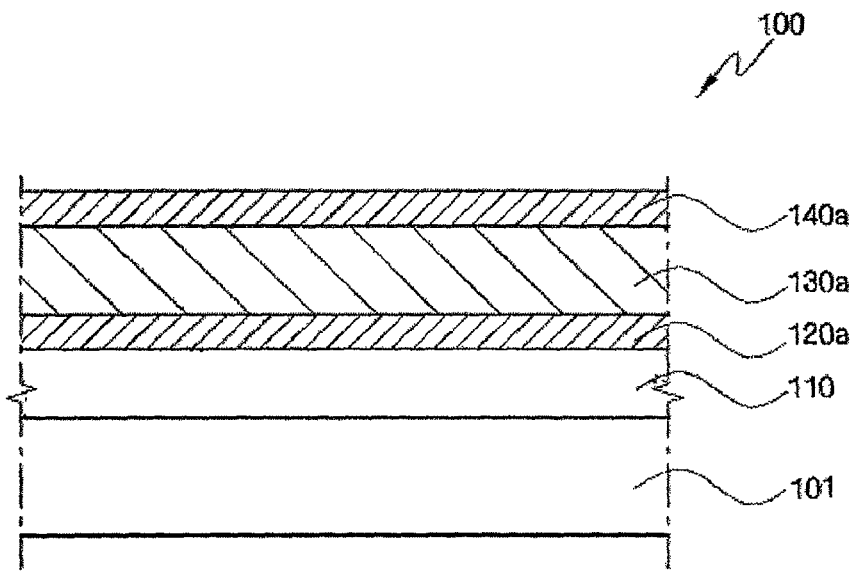

Subsequently, as illustrated in FIG. 4, a second soft magnetic thin film 140a is formed on the metal film 130a.

The second soft magnetic thin film 140a may be deposited through a process that is similar to or the same as the process of forming the first soft magnetic thin film 120a illustrated in FIG. 2. That is, sputtering may be performed using a target containing Fe, Co, Ni or alloys thereof and at least one element selected from Ti, Hf, or B, in an $N_2$ reactive gas environment. Thus, since a similar or the same process is applied, a redundant description thereof is omitted.

Similar to the first soft magnetic thin film 120a, the second soft magnetic thin film 140a can also have high magnetic permeability. Further, since both the second soft magnetic thin film 140a and the metal film 130a are conductive films, the thickness of the overall conductive film may be increased. Thus, even though the thickness is not changed by the metal wiring process, the thickness of the conductive film having the metal film 130a may increase.

In this way, when the second soft magnetic thin film 140a having high magnetic permeability is deposited, the inductance (L) increases and the thickness of the conductive film having the metal film 130a increases to therefore lower the resistance (R) and increase quality factor (Q).

Figure 5:
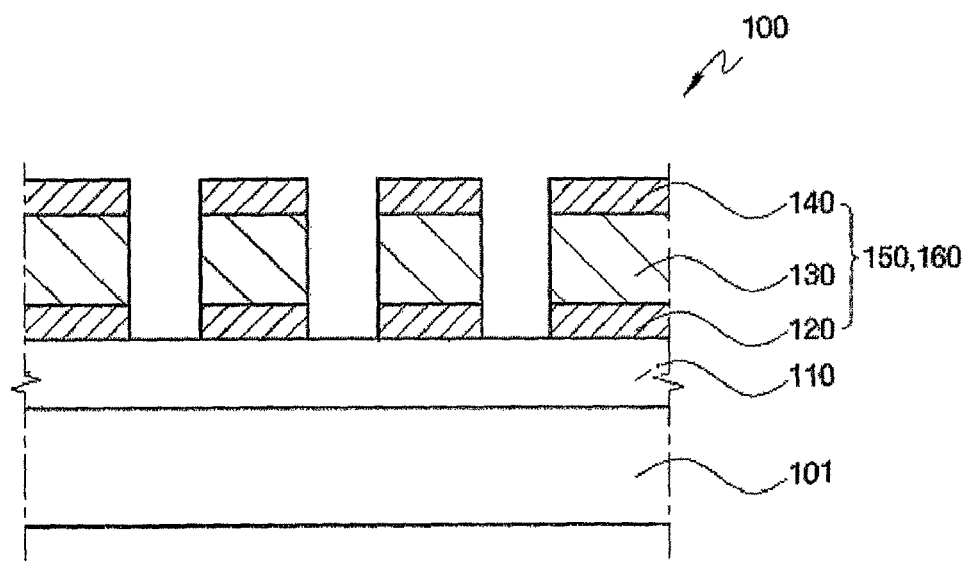

Subsequently, as illustrated in FIG. 5, the sequentially laminated first soft magnetic thin film 120a, metal film 130a, and second soft magnetic thin film 140a are patterned using the same mask.

In this case, the patterning process is conducted such that the second soft magnetic thin film 140a, the metal film 130a, and the first soft magnetic thin film 120a are sequentially etched, since the materials of these films are different from each other.

To this end, a positive or negative photoresist (PR) (not shown) is first deposited on the second soft magnetic thin film 140a. The thickness of the deposited PR may be a thickness having a margin range in consideration of the first soft magnetic thin film 120a, the metal film 130a, and the second soft magnetic thin film 140a, which are laminated together. For example, the thickness of the PR may be about 3.5 μm or more.

Subsequently, the second soft magnetic thin film 140a is etched.

The second soft magnetic thin film 140a is etched under process conditions that allow good etching selectivity so as not to etch the first soft magnetic thin film 120a and the metal film 130a. In this case, the etching process may be dry etching such as a plasma etch.

Subsequently, the metal film 130a is etched.

The metal film 130a is etched under process conditions that allow good etching selectivity so as not to etch the first soft magnetic thin film 120a. In this case, the etching process may be dry etching such as a plasma etch.

Then, the first soft magnetic thin film 120a is etched. The etching process may also be dry etching such as a plasma etch. Thereafter, the PR is removed.

The inductor 150 and the uppermost wire layer 160 coupled with the lower wire layer 105, 107 (FIG. 1) may thereby be completed on the interlayer insulating film 110. Similar to the inductor 150, the uppermost wire layer 160 is formed by depositing the first and second soft magnetic thin film patterns 120, 140, such that resistance is decreased, resulting in improved wire properties.

Thereafter, subsequent procedures are conducted according to processes known in the art, thus completing the semiconductor device.

Figure 6:
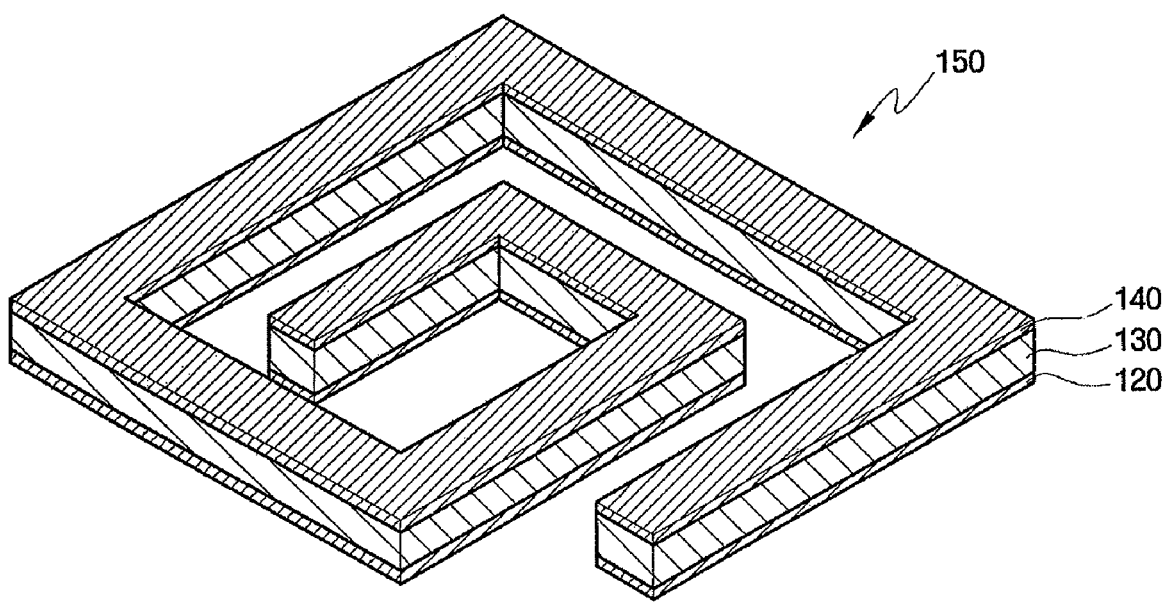
FIG. 6 illustrates a schematic, perspective view of an inductor according to a preferred embodiment of the invention.

FIG. 6 illustrates a schematic, perspective view of an inductor 150 fabricated according to a preferred embodiment of the invention.

As illustrated in FIG. 6, the first and second soft magnetic thin films 120, 140 are formed on (or under) respective upper and lower surfaces of the metal film 130. Although the inductor 150 is illustrated as having a square geometry, other (more rounded) geometries may be used.

Figure 7:
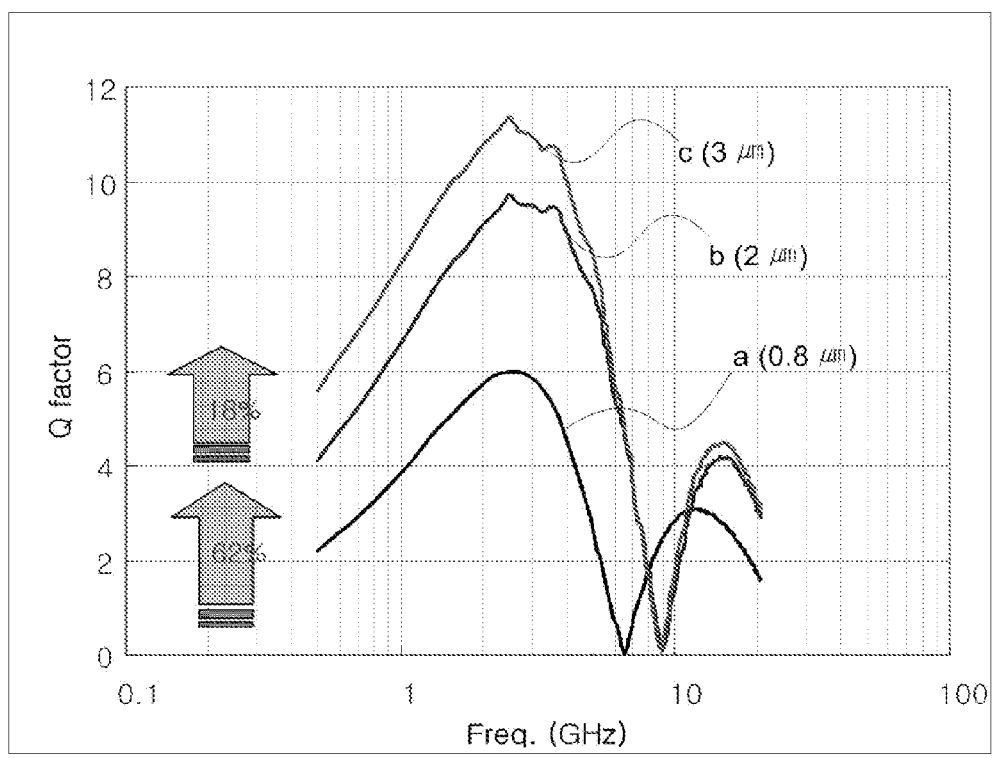
FIG. 7 illustrates a graph of results from a simulation of quality factor (Q) for a semiconductor device according to a preferred embodiment of the invention.

FIG. 7 illustrates a graph of results from a simulation test of quality factor (Q) for a semiconductor device according to a preferred embodiment of the invention. The quality factor (Q) may be seen to change depending on the thickness of the metal film. As such, test conditions are based only on an increase in the thickness of the aluminum metal film, which as illustrated in the graph of FIG. 7 are 0.8 μm (a), 2 μm (b), and 3 μm (c). In addition, the axis X indicates frequency and the axis Y indicates quality factor (Q), as defined above in Equation 2.

As is apparent from the graph illustrated in FIG. 7, the quality factor (Q) increases depending on the thickness of the aluminum metal film. Compared to the control thickness of 0.8 μm (a), a thickness of 2 μm (b) increases the quality factor (Q) by about 62%. Further, compared to the control thickness of 2 μm (b), a thickness of 3 μm (c) increases the quality factor (Q) by about 17%.

In this way, the first and second soft magnetic thin films are respectively deposited on upper and lower surfaces of the metal film, and thus the magnetic permeability is increased. Further, the thickness of the conductive film having the metal film may be increased. Therefore, resistance is decreased and inductance is increased, leading to the realization of an inductor having a high quality factor (Q). Accordingly, a semiconductor device having improved performance can be provided.

As described hereinbefore, the invention provides a semiconductor device and a method of fabricating a semiconductor device. According to the method of fabricating the semiconductor device of the invention, the following effects can be expected.

First, soft magnetic thin films are deposited on (or under) upper and lower surfaces of a metal film of an uppermost wire layer, thereby obtaining an inductor having an increased quality factor (Q).

Second, an uppermost wire layer couples with the lower wire layer to produce decreased resistance, thereby improving the properties of the metal wire.

Third, an inductor having increased quality factor (Q) is obtained, thereby providing a semiconductor device having improved performance.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of fabricating a semiconductor device, comprising:
    forming an interlayer insulating film on a semiconductor substrate;
    depositing a first soft magnetic thin film on the interlayer insulating film through sputtering using a target comprising at least one of Fe, Co, Ni, or alloys thereof, the target further comprising at least one of Ti, Hf, or B, the sputtering being performed using $N_2$ reactive gas;
    forming a metal film on the first soft magnetic thin film;
    depositing a second soft magnetic thin film on the metal film through sputtering using the same or another target comprising at least one of Fe, Co, Ni, or alloys thereof, the target further comprising at least one of Ti, Hf, or B, the sputtering being performed using $N_2$ reactive gas; and
    patterning the first soft magnetic thin film, the metal film, and the second soft magnetic thin film, which are laminated, using a same mask, to form an inductor.

2. The method as claimed in claim 1, wherein the first soft magnetic thin film and the second soft magnetic thin film each have a thickness of about 5,000-10,000 Å.

3. The method as claimed in claim 1, wherein the metal film comprises aluminum or copper.

4. The method as claimed in claim 1, wherein the depositing of the first soft magnetic thin film and the depositing of the second soft magnetic thin film are conducted using a target comprising Fe, Co and Ti.

5. The method as claimed in claim 1, wherein the interlayer insulating film comprises $SiO_x$, SiON, $TiO_x$ or $TaO_x$.

6. A method of fabricating a semiconductor device, the method comprising:
    forming an interlayer insulating film having a plurality of lower wire layers on a semiconductor substrate;
    depositing a first soft magnetic thin film on the interlayer insulating film through sputtering using a target comprising at least one of Fe, Co, Ni, or alloys thereof, the target further comprising at least one of Ti, Hf, or B, the sputtering being performed using $N_2$ reactive gas;
    forming an uppermost metal wire layer on the first soft magnetic thin film;
    depositing a second soft magnetic thin film on the uppermost metal wire layer through sputtering using the same or another target comprising at least one of Fe, Co, Ni, or alloys thereof, the target further comprising at least one of Ti, Hf, or B, the sputtering being performed using $N_2$ reactive gas; and
    patterning the first soft magnetic thin film, the uppermost metal wire layer, and the second soft magnetic thin film, which are laminated, using a same mask, thus forming an inductor and the uppermost wire layer coupled with at least one of the lower wire layers.

7. The method as claimed in claim 6, wherein the first soft magnetic thin film and the second soft magnetic thin film each have a thickness of about 5,000-10,000 Å.

8. The method as claimed in claim 6, wherein the uppermost wire layer comprises aluminum or copper.

9. The method as claimed in claim 6, wherein the depositing the first soft magnetic thin film and the depositing the second soft magnetic thin film are conducted using a target comprising Fe, Co and Ti.

10. The method as claimed in claim 6, wherein the interlayer insulating film comprises $SiO_x$, SiON, $TiO_x$ or $TaO_x$.

* * * * *